(12) United States Patent  
Kim et al.

(10) Patent No.: US 7,419,918 B2
(45) Date of Patent: Sep. 2, 2008

(54) METHODS OF FORMING A THIN-FILM STRUCTURE, METHODS OF MANUFACTURING NON-VOLATILE SEMICONDUCTOR DEVICES USING THE SAME, AND RESULTING NON-VOLATILE SEMICONDUCTOR DEVICES

(75) Inventors: Chul-Sung Kim, Gyeonggi-do (KR); Yu-Gyun Shin, Gyeonggi-do (KR); Bon-Young Koo, Gyeonggi-do (KR); Ji-Hyun Kim, Gyeonggi-do (KR); Young-Jin Noh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 11/399,670

(22) Filed: Apr. 6, 2006

(65) Prior Publication Data

US 2006/0228841 A1   Oct. 12, 2006

(30) Foreign Application Priority Data

Apr. 7, 2005   (KR) ...................... 10-2005-0028800

(51) Int. Cl.
*H01L 21/31* (2006.01)

(52) U.S. Cl. ..................................... 438/775

(58) Field of Classification Search ................. 438/775, 438/791, 795, 264; 257/311, 321
See application file for complete search history.

(56) References Cited

U.S. PATENT DOCUMENTS

| 5,591,681 | A | 1/1997 | Wristers et al. ............. 437/240 |
| 6,001,713 | A | 12/1999 | Ramsbey et al. |
| 6,461,984 | B1 | 10/2002 | Han et al. .................... 438/788 |
| 6,559,007 | B1* | 5/2003 | Weimer ....................... 438/257 |
| 6,610,615 | B1 | 8/2003 | McFadden et al. |
| 2005/0199944 | A1* | 9/2005 | Chen et al. .................. 257/324 |
| 2006/0250511 | A1* | 11/2006 | Lyu et al. .................... 348/294 |

FOREIGN PATENT DOCUMENTS

| JP | 10-163348 | 6/1998 |
| KR | 1020010051370 A | 6/2001 |
| KR | 1020040004797 A | 1/2004 |
| KR | 1020040004836 A | 1/2004 |

OTHER PUBLICATIONS

Notice to Submit Response in Korean Application No. 10-2005-0028800; Date of mailing May 25, 2006.
Translation of Notice to Submit Response in Korean Application No. 10-2005-0028800; Date of mailing May 25, 2006.

* cited by examiner

*Primary Examiner*—Calvin Lee
(74) *Attorney, Agent, or Firm*—Myers Bigel Sibley & Sajovec

(57) ABSTRACT

In a method of forming a thin-film structure employed in a non-volatile semiconductor device, an oxide film is formed on a substrate. An upper nitride film is formed on the oxide film by nitrifying an upper portion of the oxide film through a plasma nitration process. A lower nitride film is formed between the substrate and the oxide film by nitrifying a lower portion of the oxide film through a thermal nitration process. A damage to the thin-film structure generated in the plasma nitration process may be at least partially cured in the thermal nitration process, and/or may be cured in a post-thermal treatment process.

23 Claims, 15 Drawing Sheets

METHODS OF FORMING A THIN-FILM STRUCTURE, METHODS OF MANUFACTURING NON-VOLATILE SEMICONDUCTOR DEVICES USING THE SAME, AND RESULTING NON-VOLATILE SEMICONDUCTOR DEVICES

CLAIM OF PRIORITY AND CROSS REFERENCE TO RELATED APPLICATION

This application claims priority under 35 USC § 119 to Korean Patent Application No. 10-2005-0028800 filed on Apr. 7, 2005, the disclosure of which is incorporated herein by reference in its entirety.

FIELD OF THE INVENTION

The present invention relates to methods of forming a thin-film structure and methods of manufacturing a non-volatile semiconductor device using the method of forming the thin-film structure. More particularly, the present invention relates to methods of forming a thin-film structure having improved electrical characteristics, and methods of manufacturing a non-volatile semiconductor device having a thin-film structure having improved electrical characteristics.

BACKGROUND

Semiconductor memory devices may generally be classified as volatile semiconductor devices and non-volatile semiconductor devices. A volatile semiconductor device, for example, a random-access memory (RAM) device, may have a rapid response speed but loses stored data when power is turned off. A non-volatile semiconductor device, such as a read-only memory (ROM) device, may have a slower response speed but maintains the stored data when power is turned off. Conventional ROM devices have the additional limitation that data may not be stored in them after initial programming.

Non-volatile semiconductor devices, such as electrically erasable programmable ROM (EEPROM) devices and/or flash memory devices, are widely used in various electric or electronic devices, because data may be electrically programmed into an EEPROM device and/or a flash memory device, and/or may be erased from the EEPROM or the flash memory device.

In the flash memory device, data may be electrically programmed and/or erased using a Fowler-Nordheim tunneling mechanism and/or a hot electron injection mechanism.

To manufacture a conventional flash memory device, a tunnel oxide layer is typically formed on an active region of a semiconductor substrate, and then a floating gate is formed on the tunnel oxide layer. After a dielectric layer is formed on the floating gate, a control gate is formed on the dielectric layer. Impurities are doped into portions of the active region adjacent to the floating gate so as to form impurity regions.

A conventional flash memory device typically has a stacked structure that includes the tunnel oxide layer, the floating gate, the dielectric layer and the control gate sequentially formed on the semiconductor substrate. When proper voltages are applied to the control gate and the impurity region, electrons are injected into the floating gate from the impurity region so that data is programmed into the conventional flash memory device.

To inject the electrons into the floating gate, the voltages applied to the control gate and the impurity region should be larger than a threshold voltage (Vth) of the conventional flash memory device. The threshold voltage of the flash memory device mainly depends on characteristics of the tunnel oxide layer. When the tunnel oxide layer has poor characteristics, the threshold voltages of unit cells in the flash memory device may be different from one another, which may reduce the reliability of the flash memory device.

To improve the characteristics of the tunnel oxide layer, U.S. Pat. No. 5,591,681 (issued to Dirk J. Wristers, et al.) describes a method of forming a tunnel oxide layer having a surface portion that contains nitrogen, by thermally treating the tunnel oxide layer under a nitric oxide (NO) gas atmosphere. However, since a tunnel oxide layer formed according to the techniques described in the above U.S. patent may not have a dense structure, leakage current through the tunnel oxide layer may be increased.

Korean Laid-Open Patent Publication No. 2004-4797 discloses a method of forming a tunnel oxide layer by nitrifying an oxide layer using a plasma, or by thermally nitrifying the oxide layer. However, the tunnel oxide layer may be damaged during the process of nitrifying of the oxide layer, which may also result in increased leakage current through the tunnel oxide layer.

SUMMARY

Some embodiments of the present invention provide methods of forming a thin-film structure including an upper nitride film and a lower nitride film. A thin film structure according to some embodiments of the present invention may have improved electrical characteristics.

Some embodiments of the present invention provide methods of manufacturing a non-volatile semiconductor device including the thin-film structure as a tunnel oxide layer. A non-volatile semiconductor memory device formed in accordance with some embodiments of the present invention may have enhanced reliability and/or improved electrical characteristics.

Methods of forming a thin-film structure according to some embodiments of the present invention include forming an oxide film on a substrate, and forming an upper nitride film on the oxide film by nitrifying an upper portion of the oxide film through a plasma nitration process. A lower nitride film may be formed between the substrate and the oxide film by nitrifying a lower portion of the oxide film through a thermal nitration process.

In some embodiments of the present invention, a damage to the thin-film structure generated in the plasma nitration process may be at least partially cured in the thermal nitration process.

In some embodiments of the present invention, a post-thermal treatment may be performed on the thin-film structure to at least partially cure a damage to the thin-film structure generated in the plasma nitration process. The post-thermal treatment process may be executed at a temperature between about 800° C. and about 1,100° C. using a reaction gas that may include an $N_2$ gas, an NO gas, an $N_2O$ gas and/or an $NH_3$ gas. These gases can be used alone or in a mixture thereof. In some embodiments, the thermal nitration process may be carried out before the plasma nitration process.

In some embodiments of the present invention, the lower nitride film may be formed at a temperature between about 800° C. and about 1,100° C. using a reaction gas that may include an $N_2$ gas, an NO gas, an $N_2O$ gas and/or an $NH_3$ gas. These gases can be used alone or in a mixture thereof.

In some embodiments of the present invention, the upper nitride film may be formed by generating a plasma from a reaction gas including an $N_2$ gas, an NO gas, an $N_2O$ gas and/or an $NH_3$ gas, and by nitrifying the upper portion of the oxide film using the plasma.

In some embodiments of the present invention, the plasma nitration process and the thermal nitration process may be carried out in-situ.

In methods of forming a thin-film structure according to further embodiments of the invention, after an oxide film is formed on a substrate, a first preliminary thin-film structure is formed on the substrate by nitrifying an upper portion of the oxide film through a plasma nitration process. The first preliminary thin-film structure includes the oxide film and an upper nitride film formed on the oxide film. A second preliminary thin-film structure is formed on the substrate by nitrifying a lower portion of the oxide film through a thermal nitration process. The second preliminary thin-film structure includes a lower nitride film formed between the substrate and the oxide film, the oxide film and the upper nitride film. The thin-film structure is formed by at least partially curing a damage to the second preliminary thin-film structure generated in the plasma nitration process through a post-thermal treatment process.

In some embodiments of the present invention, the post-thermal treatment process may be performed at a temperature between about 800° C. and about 1,100° C. using a reaction gas that may include an $N_2$ gas, an NO gas, an $N_2O$ gas and/or an $NH_3$ gas.

Methods of manufacturing a non-volatile semiconductor device are provided according to still further embodiments of the present invention. In some methods of manufacturing the non-volatile semiconductor device, a tunnel oxide layer is formed on a substrate. The tunnel oxide layer is formed by forming an oxide film on the substrate, by forming an upper nitride film on the oxide film by nitrifying an upper portion of the oxide film through a plasma nitration process, and by forming a lower nitride film between the substrate and the oxide film by nitrifying a lower portion of the oxide film through a thermal nitration process. Then, a preliminary floating gate is formed on the tunnel oxide layer. After a dielectric layer and a preliminary control gate are sequentially formed on the preliminary floating gate, a floating gate, a dielectric layer pattern and a control gate are formed by patterning the preliminary control gate, the dielectric layer and the preliminary floating gate.

In some embodiments of the present invention, before forming the oxide film, an insulation layer pattern for defining an active region of the substrate may be formed on the substrate and the substrate including the insulation layer pattern may be cleaned.

In some embodiments of the present invention, a post-thermal treatment may be carried out on the tunnel oxide layer to at least partially cure a damage to the tunnel oxide layer generated in the plasma nitration process. The post-thermal treatment may be performed at a temperature between about 800° C. and about 1,100° C. using a reaction gas that may include an $N_2$ gas, an NO gas, an $N_2O$ gas and/or an $NH_3$ gas. In some embodiments, the thermal nitration process may be carried out before the plasma treatment process.

In some embodiments of the present invention, a damage to the tunnel oxide layer generated in the plasma nitration process may be at least partially cured in the thermal nitration process.

In some embodiments of the present invention, the lower nitride film may be performed at a temperature between about 800° C. and about 1,100° C. using a reaction gas including an $N_2$ gas, an NO gas, an $N_2O$ gas and/or an $NH_3$ gas.

In some embodiments of the present invention, the upper nitride film may be formed by generating a plasma from a reaction gas including an $N_2$ gas, an NO gas, an $N_2O$ gas and/or an $NH_3$ gas, and by nitrifying the upper portion of the oxide film using the plasma.

In some embodiments of the present invention, the plasma nitration process and the thermal nitration process may be carried out in-situ.

According to some embodiments of the present invention, a thin-film structure including a lower nitride film, an oxide film and an upper oxide film may be obtained through a plasma nitration process, a thermal nitration process and/or a post-thermal treatment process. Since the thin-film structure includes the lower and the upper nitride films, hydrogen atoms and/or ions may not substantially penetrate into the thin-film structure in a subsequent process carried out under an atmosphere containing hydrogen. When the thin-film structure is employed as a tunnel oxide layer in a non-volatile semiconductor device, the tunnel oxide layer may have enhanced electrical characteristics by having reduced charge trapping sites, dangling bonds of silicon and oxygen, and/or strains generated due to the bonds of silicon and oxygen. Additionally, the tunnel oxide layer may be formed without forming a bird's beak. As a result, a non-volatile semiconductor device including a tunnel oxide layer formed according to some embodiments of the invention may have improved electrical characteristics and/or may have enhanced reliability.

A non-volatile semiconductor memory device according to some embodiments of the invention includes a tunnel oxide layer on a substrate. The tunnel oxide layer includes a first nitrogen concentration peak near an interface of the tunnel oxide layer and the substrate, and a second nitrogen concentration peak near a surface of the tunnel oxide layer opposite the interface between the tunnel oxide layer and the substrate. The device further includes a floating gate on the tunnel oxide layer, a dielectric layer on the floating gate, and a control gate on the dielectric layer.

The non-volatile semiconductor memory device may further include an oxygen concentration peak in the tunnel oxide layer between the first and second nitrogen concentration peaks.

The dielectric layer may include an oxide/nitride/oxide structure and/or a metal oxide. The control gate may include doped polysilicon and/or polycide.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF EMBODIMENTS OF THE INVENTION

Figure 1:
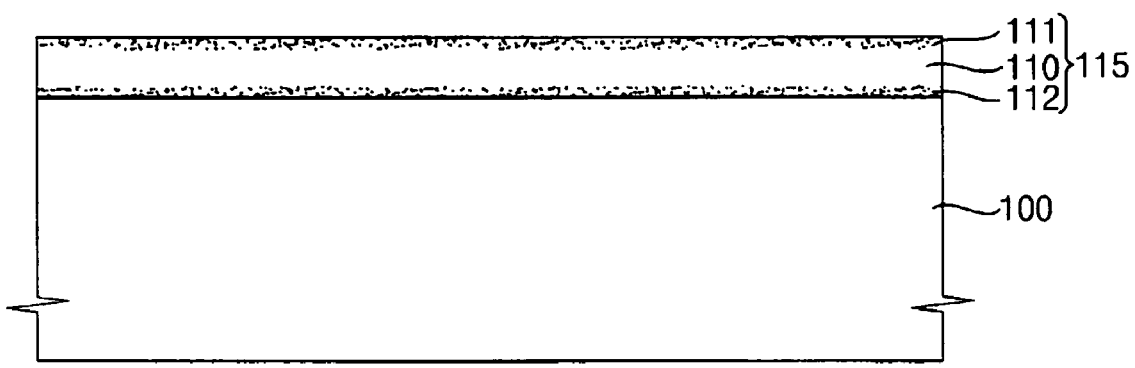
FIG. 1 is a cross-sectional view illustrating a thin-film structure in accordance with some embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant content at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Thin-Film Structure

FIG. 1 is cross-sectional view illustrating a thin-film structure formed in accordance with some embodiments of the present invention.

Referring to FIG. 1, a thin-film structure 115 may be provided on a substrate 100, which may be, for example, a silicon wafer, a silicon-on-insulator (SOI) substrate, or any other suitable semiconductor substrate.

The thin-film structure 115 includes an upper nitride film 111, an oxide film 110 and a lower nitride film 112.

In some embodiments of the present invention, the upper nitride film 111 of the thin-film structure 115 may be formed by nitrifying an upper portion of the oxide film 110 using a plasma that includes nitrogen. In other words, the upper nitride film 111 may be obtained through a plasma nitration process. When the oxide film 110 includes silicon oxide ($SiO_2$), the upper nitride film 111 may include silicon nitride ($Si_3N_4$) after the plasma nitration process. In the plasma nitration process for forming the upper nitride film 111, nitrogen radicals generated from the nitrogen-containing plasma may penetrate into the upper portion of the oxide film 110, so that nitrogen atoms may accumulate at the upper portion of the oxide film 110. The accumulated nitrogen atoms may react with silicon contained in the upper portion of the oxide film 110, and thus the upper portion of the oxide film 110 may be converted into the upper nitride film 111. Hence, the upper nitride film 111 may include bonds of silicon and nitrogen.

When the thin-film structure 115 including the upper nitride film 111 is employed as a tunnel oxide layer of a non-volatile semiconductor device such as a flash memory device, the upper nitride film 111 may effectively withstand repeated programming and/or erasing of the non-volatile semiconductor device, because the thin-film structure 115 may not be damaged by hot electrons injected into or extracted from a floating gate of the non-volatile semiconductor device through the thin-film structure 115 as much as a thin-film structure that does not include an upper nitride film 111. In addition, hydrogen atoms and/or ions may not penetrate into the thin-film structure 115 when the thin-film structure 115 undergoes a process carried out under an atmosphere including hydrogen, because the upper nitride film 111 of the thin-film structure 115 includes bonds of silicon and nitrogen.

In some embodiments of the present invention, the lower nitride film 112 of the thin-film structure 115 may be formed by thermally nitrifying a lower portion of the oxide film 110 under an atmosphere including nitrogen. That is, the lower nitride film 112 may be obtained by a thermal nitration process. In a thermal nitration process for forming the lower nitride film 112, nitrogen atoms generated by thermal decomposition of a nitrogen-containing gas may be diffused into the lower portion of the oxide film 110. Thus, the diffused nitrogen atoms may accumulate at an interface between the substrate 100 and the oxide film 110. Therefore, the lower portion of the oxide film 110 may be changed into the lower nitride film 112 including bonds of silicon and nitrogen as a result of a reaction between the accumulated diffused nitrogen and silicon in the lower portion of the oxide film 110.

Since a thin-film structure 115 having the lower nitride film 112 may not be damaged by hot electrons injected into or extracted from the floating gate through the thin-film structure 115, the thin-film structure 115 having the upper and the lower nitride films 111 and 112 may more effectively withstand repeated programming and/or erasing of the non-volatile semiconductor device. Moreover, since the thin-film structure 115 includes the lower and the upper nitride films 112 and 111 which have bonds of silicon and nitrogen, hydrogen atoms and/or ions may be effectively blocked from penetrating into the thin-film structure 115 when the thin-film structure 115 is subjected to a subsequent process performed under an atmosphere including hydrogen. Furthermore, the thin-film structure 115 may have a reduced concentration of trap sites therein where electrons may be trapped because of the formation of the upper and the lower nitride films 111 and 112. Thus, the non-volatile semiconductor device may have more improved reliability when the thin-film structure 115 is used as the tunnel oxide layer.

In some embodiments of the present invention, after the formation of the lower nitride film 112, the thin-film structure 115 may be treated by a post-nitration process so as to at least partially cure a damage to the thin-film structure 115, and/or to densify structures of the lower and the upper nitride films 112 and 111. Namely, the thin-film structure 115 may be annealed to at least partially cure the damage generated in the upper nitride film 111, the oxide film 110 and/or the lower nitride film 112. Therefore, the thin-film structure 115 may have improved electrical characteristics.

As described above, since the thin-film structure 115 includes the lower nitride film 112, the oxide film 110 and the upper nitride film 111, the thin-film structure 115 includes bonds of silicon and nitrogen without reduced damage and/or trapping sites. Thus, the thin-film structure 115 may have enhanced electrical characteristics and/or a reduced leakage current. When the thin-film structure 115 is employed as a tunnel oxide layer, the resulting non-volatile semiconductor device may have improved reliability. Additionally, since the thin-film structure 115 has the lower nitride film 112 and the upper nitride film 111, the bird's beak phenomenon may not occur at end portions of the thin-film structure.

Methods of Forming a Thin-Film Structure

Figure 2:
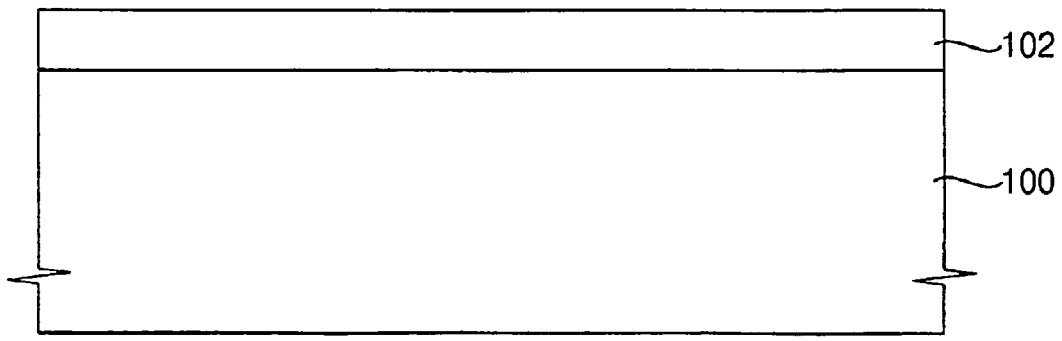
FIGS. 2 to 4 are cross-sectional views illustrating methods of forming a thin-film structure in accordance with some embodiments of the present invention.
Figure 3:
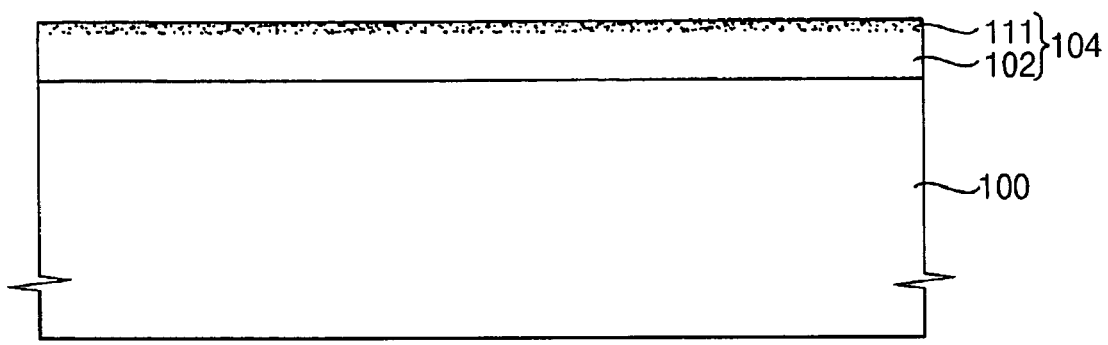
Figure 4:
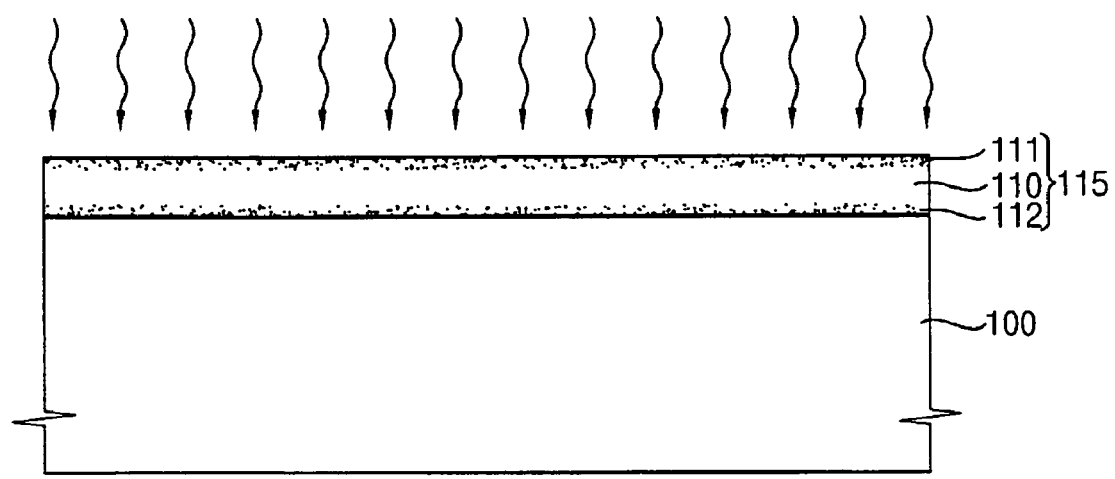

FIGS. 2 to 4 are cross-sectional views illustrating methods of forming a thin-film structure in accordance with some embodiments of the present invention.

Referring to FIG. 2, an oxide film 102 is formed on a substrate 100 such as a silicon wafer or an SOI substrate. An isolation layer (not shown) may be formed on the substrate 100 to define an active region and a field region. In that case, the oxide film 102 may be formed on the active region.

The oxide film 102 may include silicon oxide. The oxide film 102 may be formed, for example, by a low-pressure chemical vapor deposition (LPCVD) process. Alternatively, the oxide film 102 may be formed by a wet oxidation process and/or a thermal oxidation process.

In the thermal oxidation process for forming the oxide film 102, the substrate 100 may be thermally treated under an atmosphere including an oxygen ($O_2$) gas. Thus, the oxide film 102 may be formed on the substrate 100 through a reaction between oxygen and silicon contained in the substrate 100.

Figure 5:
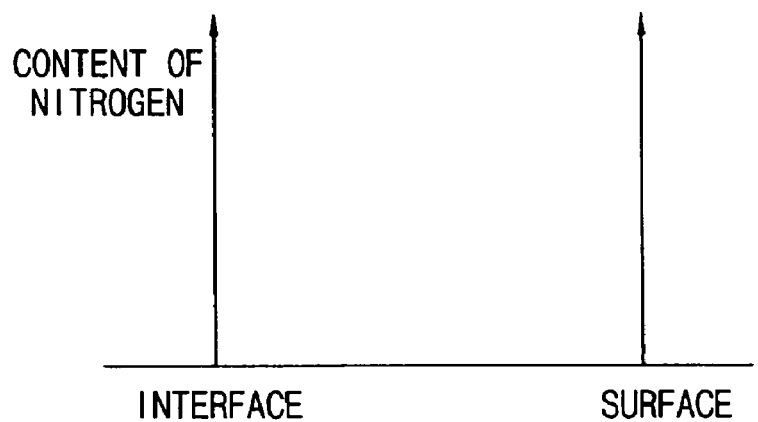
FIG. 5 is a graph illustrating a content of nitrogen in an oxide film in accordance with some embodiments of the present invention.

FIG. 5 is a graph illustrating an exemplary concentration of nitrogen in the oxide film 102. In FIG. 5, "interface" indicates an interface between the substrate 100 and the oxide film 102 and "surface" means a surface of the oxide film 102.

As shown in FIG. 5, nitrogen atoms may not substantially exist in a high concentration in the oxide film 102 when the oxide film 102 is formed through a wet oxidation process and/or a thermal oxidation process.

Referring to FIG. 3, a plasma nitration process is carried out on the substrate 100 having the oxide film 102 thereon to form a preliminary thin-film structure 104 on the substrate 100. The preliminary thin-film structure 104 includes an upper nitride film 111 formed on the oxide film 102. The upper nitride film 111 may be formed by nitrifying an upper portion of the oxide film 102, for example, using a plasma including nitrogen. That is, the upper portion of the oxide film 102 may be changed into the upper nitride film 111 through a plasma nitration process. In particular, nitrogen atoms may accumulate at the upper portion of the oxide film 102, to thereby form the preliminary thin-film structure 104 having the upper nitride film 111 that includes bonds of silicon and nitrogen.

Figure 6:
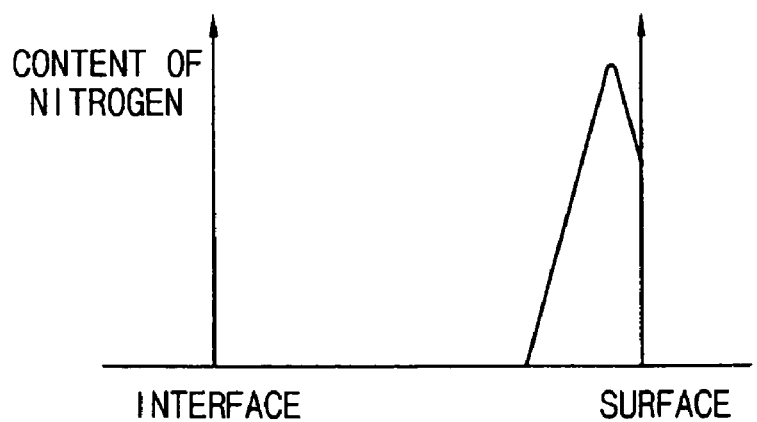
FIG. 6 is a graph illustrating a content of nitrogen in a preliminary thin-film structure in accordance with some embodiments of the present invention.

FIG. 6 is a graph illustrating an exemplary concentration of nitrogen in the preliminary thin-film structure 104. In FIG. 6, "interface" represents an interface between the substrate 100 and the preliminary thin-film structure 104, and "surface" indicates a surface of the preliminary thin-film structure 104 corresponding to a surface of the upper nitride film 111.

Referring to FIG. 6, since the preliminary thin-film structure 104 includes the upper nitride film 111 formed by the plasma nitration process, nitrogen atoms may exist in a relatively high concentration only in the upper nitride film 111. That is, the nitrogen atoms may not substantially exist in high concentrations at portions of the preliminary thin-film structure 104 except for the upper nitride film 111 of the preliminary thin-film structure 104.

Some example processes for forming the preliminary thin-film structure 104 will now be described. After the substrate 100 having the oxide film 102 formed thereon is loaded into a process chamber, a first reaction gas including nitrogen is introduced into the process chamber. The first reaction gas may include a nitrogen-containing gas such as a nitrogen ($N_2$) gas, an ammonia ($NH_3$) gas, a nitrous oxide ($N_2O$) gas, and/or a nitric oxide (NO) gas. These gases can be used alone or in a mixture thereof. The first reaction gas may be introduced into reaction chamber together with a carrier gas. The carrier gas may include an inactive gas, for example, an argon (Ar) gas and/or or a helium (He) gas. The reaction chamber may have a pressure of from about 1.0 mTorr to about 10 Torr and a temperature of from about 20° C. to about 1,000° C. during the formation of the upper nitride film 111.

A plasma including nitrogen radicals (N*) is generated from the first reaction gas by exciting the first reaction gas with a predetermined power. The plasma is formed over the substrate 100 in the reaction chamber. The nitrogen radicals in the plasma may penetrate into the upper portion of the oxide film 102 so that nitrogen atoms may accumulate in the upper portion of the oxide film 102. Therefore, the upper portion of the oxide film 102 may be converted into the upper nitride film 111 as a result of a reaction between nitrogen and silicon contained in the oxide film 102.

In some embodiments of the present invention, the plasma including nitrogen radicals may be formed using a remote plasma generating apparatus separated from the process chamber, and then the plasma may be provided over the substrate 100 loaded in the reaction chamber.

The upper nitride film 111 includes bonds of silicon and oxygen, so that the upper nitride film 111 may have a dense structure. Thus, the upper nitride film 111 may not be damaged by hot electrons injected into a floating gate of a non-volatile semiconductor device and/or extracted from the floating gate, when the preliminary thin-film structure 104 is used as a tunnel oxide layer of the non-volatile semiconductor device. Additionally, hydrogen atoms and/or ions may not penetrate into the upper nitride film 111 during a subsequent process carried out under an atmosphere containing hydrogen.

Referring to FIG. 4, a thin-film structure 115 having a lower nitride film 112 is formed on the substrate 100 through a thermal nitration process.

Processes for forming the lower nitride film 112 will now be described. After the substrate 100 having the preliminary thin-film structure 104 thereon is loaded into a process chamber, a second reaction gas is provided onto the substrate 100. The second reaction gas may include a nitrogen ($N_2$) gas, an ammonia ($NH_3$) gas, a nitrous oxide ($N_2O$) gas, and/or a nitric oxide (NO) gas. These gases can be used alone or in a mixture thereof. In some embodiments of the present invention, the first reaction gas may be substantially the same as the second reaction gas. In other embodiments of the present invention, the second reaction gas may be different from the first reaction gas. The lower nitride film 112 is formed from a lower portion of the oxide film 102 as a result of a reaction of nitrogen atoms and silicon atoms in the oxide film 102. The nitrogen atoms may be generated in the reaction chamber by thermally decomposing the second reaction gas. That is, the lower nitride film 112 may be formed through a thermal nitration process. In some embodiments of the present invention, the thermal nitration process may include a rapid thermal process (RTP) carried out a temperature of from about 800° C. to about 1,000° C. for several tens of seconds. Alternatively or additionally, the thermal nitration process may be performed using a furnace that has a temperature of from about 500° C. to about 1,200° C. for a time of several seconds to several tens of seconds.

In some embodiments of the present invention, the plasma nitration process and/or the thermal nitration process may be executed in-situ using one process chamber. Namely, the upper nitride film 111 and the lower nitride film 112 may be formed in-situ.

In the thermal nitration process, damage to the oxide film 102 that may occur during the plasma nitration process may be at least partially cured. Additionally, trap sites in the thin-film structure 115 may be reduced after the thermal nitration process. Furthermore, the thermal nitration process may remove dangling bonds of silicon and/or oxygen in the thin-film structure 115, strains caused by a reaction of silicon and oxygen in the thin-film structure 115, and/or stretches generated by the reaction of silicon and oxygen in the thin-film structure 115. Therefore, the thin-film structure 115 may have enhanced electrical characteristics and/or reliability.

In the thermal nitration process, nitrogen atoms generated by a thermal decomposition of the second reaction gas may accumulate at a lower portion of the oxide film 102 adjacent to an interface between the substrate 100 and the oxide film 102. Additionally, the nitrogen atoms in the upper nitride film 111 may be thermally diffused toward the lower portion of the oxide film 102. Hence, the lower nitride film 112 may be formed from the lower portion of the oxide film 102 as a result of a reaction between nitrogen and silicon at the lower portion of the oxide film 102.

Figure 7:
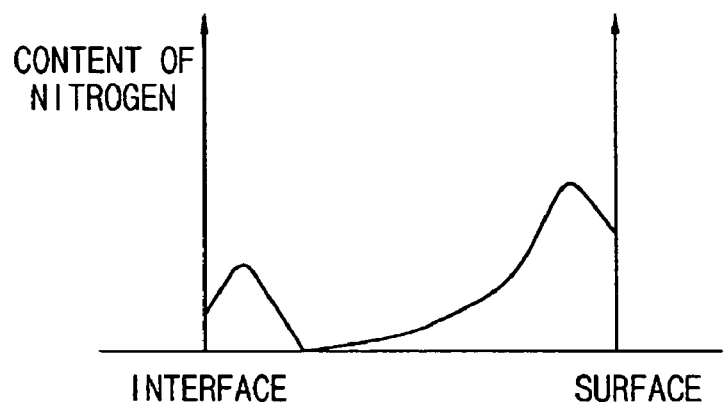
FIG. 7 is a graph illustrating a content of nitrogen in a thin-film structure in accordance with some embodiments of the present invention.

FIG. 7 is a graph illustrating an exemplary concentration of nitrogen in the thin-film structure 115 in accordance with some embodiments of the present invention. In FIG. 7, "interface" denotes an interface between the substrate 100 and the thin-film structure 115, and "surface" means a surface of the thin-film structure 115 corresponding to the surface of the upper nitride film 111.

Referring to FIG. 7, nitrogen atoms exist in relatively high concentrations in both the upper nitride film 111 and the lower nitride film 112 of the thin-film structure 115, whereas the nitrogen atoms may not exist in the oxide film 102 at high concentrations and/or a minute concentration of the nitrogen atoms may exist in the oxide film 102.

Since the thin-film structure 115 includes the lower and the upper nitride films 112 and 111, hydrogen atoms and/or ions may not penetrate into the thin-film structure 115 in a subsequent process performed in an atmosphere containing hydrogen. Furthermore, electron trap sites may be reduced in the thin-film structure. Therefore, the non-volatile semiconductor device may have enhanced electrical characteristics and/or reliability when the thin-film structure 115 is employed as the tunnel oxide layer of the non-volatile semiconductor device.

FIGS. 8 to 11 are cross-sectional views illustrating methods of forming thin-film structures in accordance with some embodiments of the present invention.

Figure 8:
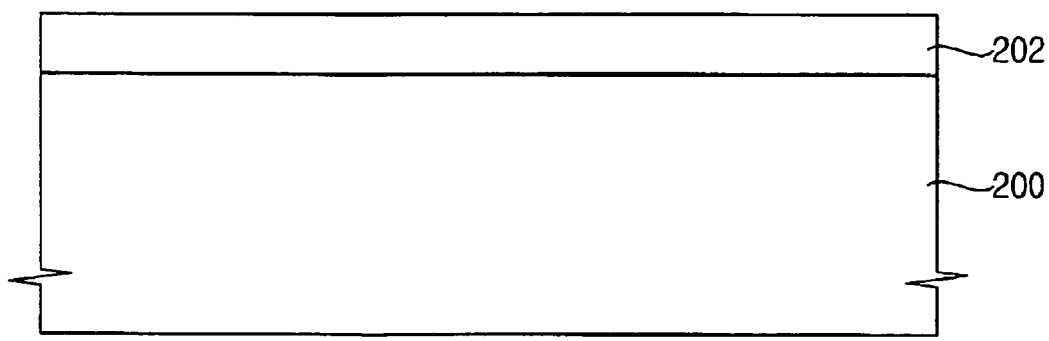
FIGS. 8 to 11 are cross-sectional views illustrating methods of manufacturing a thin-film structure in accordance with some embodiments of the present invention.

Referring to FIG. 8, an oxide film 202 is formed on a substrate 200 which may include, for example, a silicon wafer and/or an SOI substrate or other suitable semiconductor substrate. An isolation layer (not shown) may be formed on the substrate 200 so as to divide the substrate 200 into an active region and a field region, in which case the oxide film 202 may be positioned on the active region.

The oxide film 202 may include, for example, silicon oxide. The oxide film 202 may be formed by an LPCVD process, a wet oxidation process and/or a thermal oxidation process.

In a thermal oxidation process, the substrate 200 may be thermally treated under an atmosphere including an ozone ($O_3$) gas so that the oxide film 202 may be formed on the substrate 200 by oxidizing an upper portion of the substrate 200 using the ozone gas.

Figure 12:
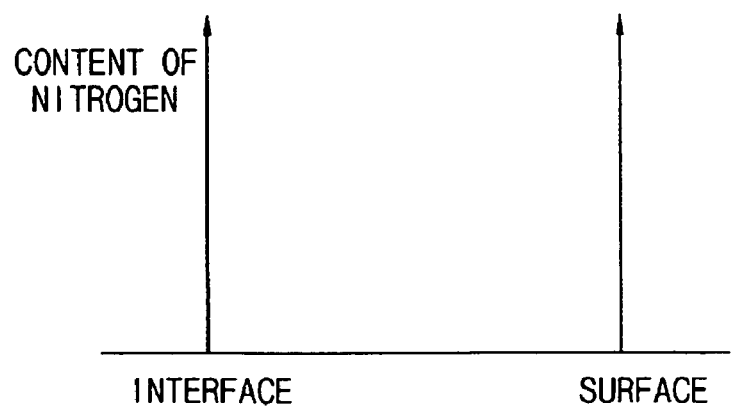
FIG. 12 is a graph illustrating a content of nitrogen in an oxide film in accordance with some embodiments of the present invention.

FIG. 12 is a graph illustrating an exemplary concentration of nitrogen in the oxide film 202. In FIG. 12, "interface" indicates an interface between the substrate 200 and the oxide film 202, and "surface" means a surface of the oxide film 202.

Referring to FIG. 12, nitrogen atoms may not substantially exist in high concentrations in the oxide film 202 when the oxide film 202 is initially formed on the substrate 200 through a wet oxidation process and/or a thermal oxidation process.

Figure 9:
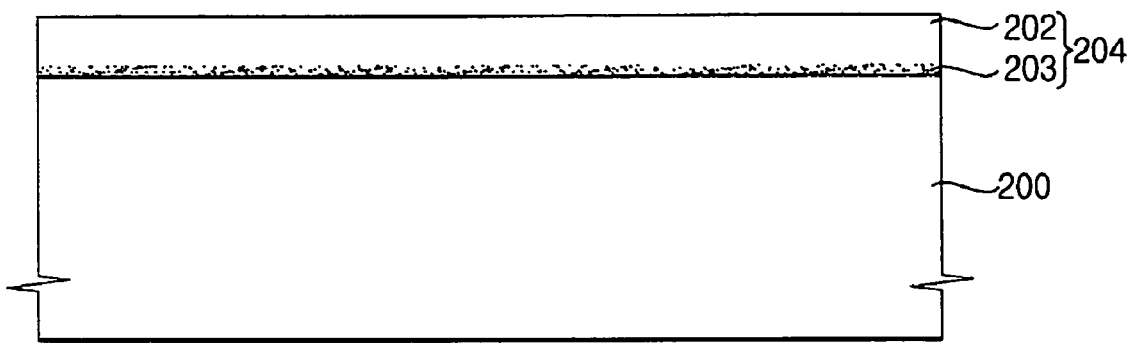

Referring to FIG. 9, a thermal nitration process is performed on the substrate 200 including the oxide film 202 to form a first preliminary thin-film structure 204 on the substrate 200. The first preliminary thin-film structure 204 includes the oxide film 202 and a lower nitride film 203 formed between the substrate 200 and the oxide film 202. The upper nitride film 203 may be formed, for example, by nitrifying a lower portion of the oxide film 202. In a thermal nitration process, nitrogen atoms may accumulate at the lower portion of the oxide film 202 to thereby form the first preliminary thin-film structure 204 having the lower nitride film 203 that includes bonds of silicon and nitrogen.

Figure 13:
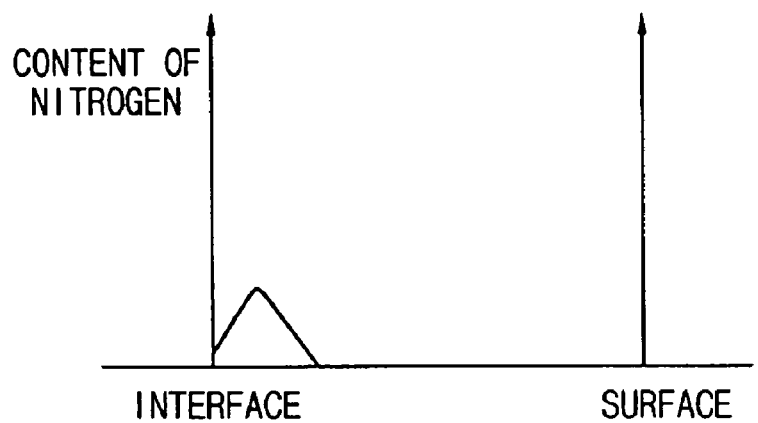
FIG. 13 is a graph illustrating a content of nitrogen in a first preliminary thin-film structure in accordance with some embodiments of the present invention.
Figure 14:
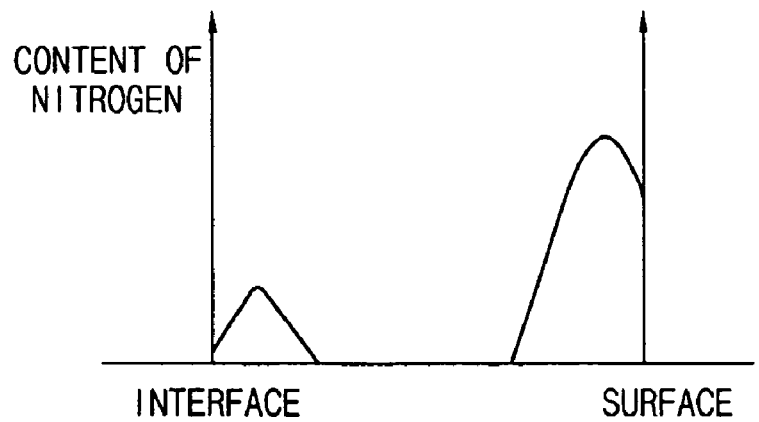
FIG. 14 is a graph illustrating a content of nitrogen in a second preliminary thin-film structure in accordance with some embodiments of the present invention.

FIG. 13 is a graph illustrating an exemplary concentration of nitrogen in the first preliminary thin-film structure 204. In FIG. 13, "interface" indicates an interface between the substrate 200 and the first preliminary thin-film structure 204, and "surface" means a surface of the first preliminary thin-film structure 204 corresponding to a surface of the oxide film 202.

As shown in FIG. 13, since the first preliminary thin-film structure 204 includes the lower nitride film 203 formed by a thermal nitration process, the nitrogen atoms may exist in relatively high concentrations only in the lower nitride film 203. That is, the nitrogen atoms may not substantially exist in high concentrations at other portions of the first preliminary thin-film structure 204.

Processes for forming the first preliminary thin-film structure 204 will now be described. The substrate 200 having the oxide film 202 is loaded into a process chamber, and then a first reaction gas including nitrogen is introduced into the process chamber. The first reaction gas may include a nitrogen gas, an ammonia gas, a nitrous oxide gas, and/or a nitric oxide gas. These gases can be used alone or in a mixture thereof.

The first reaction gas may be thermally decomposed in the process chamber so that nitrogen atoms may accumulate in the lower portion of the oxide film 202. Thus, the lower portion of the oxide film 202 may be changed into the lower nitride film 203 having bonds of silicon and nitrogen as a result of a reaction between nitrogen and silicon.

Figure 10:
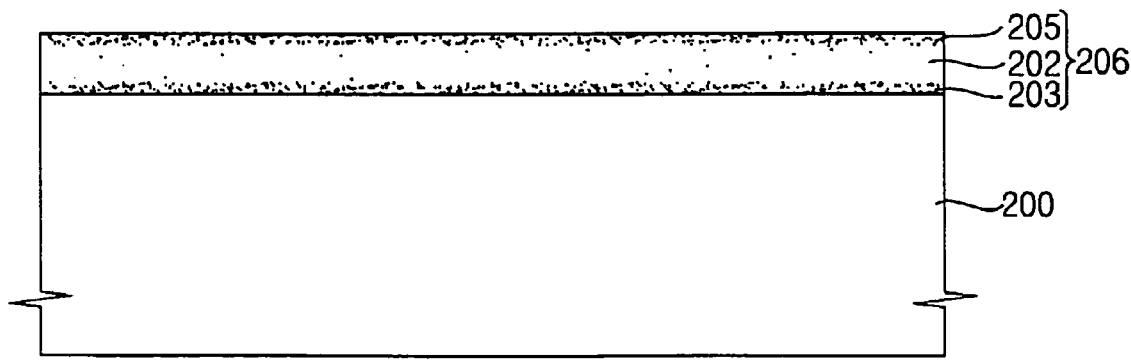

Referring to FIG. 10, a second preliminary thin-film structure 206 having an upper nitride film 205 may be formed on the substrate 200, for example, by a plasma nitration process.

In the plasma nitration process, after the substrate 200 having the first preliminary thin-film structure 204 thereon is loaded into a process chamber, a second reaction gas is provided onto the substrate 200. The second reaction gas may include nitrogen gas, ammonia gas, nitrous oxide gas, and/or nitric oxide gas. These gases can be used alone or in a mixture thereof. A plasma including nitrogen radicals (N*) is generated from the second reaction gas by exciting the second reaction gas with a predetermined power. The plasma is generated over the substrate 200 in the reaction chamber. The nitrogen radicals in the plasma may penetrate into the upper portion of the oxide film 202 so that nitrogen atoms may accumulate in the upper portion of the oxide film 202. Therefore, the upper portion of the oxide film 202 may be converted into the upper nitride film 205 as a result of a reaction between nitrogen and silicon contained in the oxide film 202.

FIG. 13 is a graph illustrating an exemplary concentration of nitrogen in the second preliminary thin-film structure 206 in accordance with some embodiments of the present invention. In FIG. 13, "interface" denotes an interface between the substrate 200 and the second preliminary thin-film structure 206, and "surface" represents a surface of the second preliminary thin-film structure 206 corresponding to a surface of the upper nitride film 205.

Referring to FIG. 13, nitrogen atoms may exist in relatively high concentrations in both the lower and the upper nitride films 203 and 205, whereas the nitrogen atoms may not substantially exist in high concentrations in the oxide film 202.

The upper nitride film 205 includes the bonds of silicon and oxygen, so that the upper nitride film 205 may have a dense structure. Hence, the upper nitride film 205 may not be damaged by hot electrons injected into a floating gate of a non-volatile semiconductor device, or extracted from the floating gate, when the second preliminary thin-film structure 206 is used as a tunnel oxide layer of the non-volatile semiconductor device. Additionally, hydrogen atoms and/or ions may not penetrate into the upper nitride film 205 in a subsequent process carried out under an atmosphere containing hydrogen.

Figure 11:
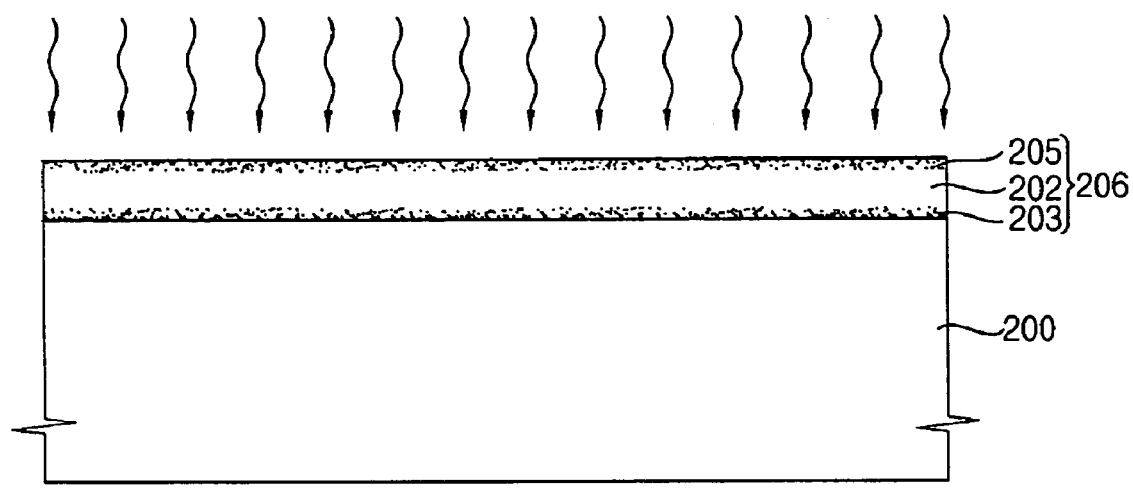

Referring to FIG. 11, the second preliminary thin-film structure 206 may be changed into a thin-film structure 210 without being substantially damaged. That is, damage to the second preliminary thin-film structure 206 may be at least partially cured to form the thin-film structure 210 on the substrate 200. In particular, the thin-film structure 210 may be formed by thermally treating the substrate 200 including the second preliminary thin-film structure 206.

A post-thermal treatment process for forming the thin-film structure 210 will now be described. In a post-thermal treatment process, the substrate 200 having second preliminary thin-film structure 206 may be positioned in a process chamber, and then a third reaction gas may be introduced into the process chamber. The third reaction gas may include a nitrogen gas, a nitrous oxide gas, a nitric oxide gas, and/or an ammonia gas. These gases can be used alone or in a mixture thereof.

The post-thermal treatment process may be performed for a time period of from several seconds to several hours in order to at least partially cure the damage to the second preliminary thin-film structure 206. In some embodiments of the present invention, the post-thermal treatment process may include an RTP (rapid thermal process) performed for a time period of from several seconds to several tens of seconds. In other embodiments of the present invention, the post-thermal treatment process may be performed using a furnace for a time period of from several minutes to several hours. As a result of the post-thermal treatment process, the thin-film structure 210 may have reduced damage such as electron trap sites, dangling bonds of silicon and oxygen, strains generated by bonding silicon with oxygen, stretches generated due to the bonds of silicon and oxygen, etc.

In the post-thermal treatment process, nitrogen atoms generated by thermally decomposing the third reaction gas may penetrate into the lower nitride film 203. Additionally, the nitrogen atoms in the upper nitride film 205 may be diffused toward the lower nitride film 203.

Figure 15:
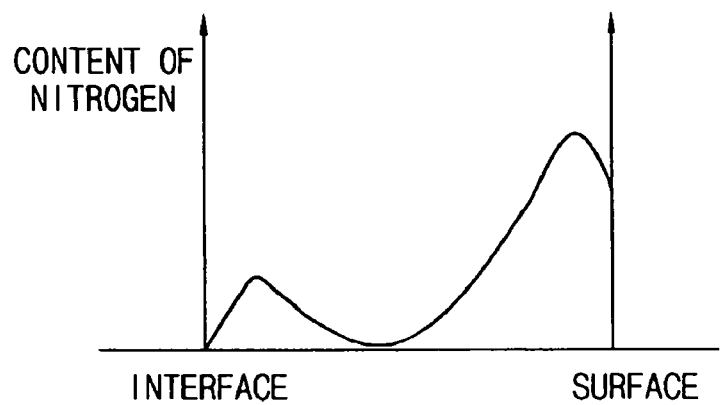
FIG. 15 is a graph illustrating a content of nitrogen in a thin-film structure in accordance with some embodiments of the present invention.

FIG. 15 is a graph illustrating an exemplary concentration of nitrogen in the thin-film structure 210 in accordance with some embodiments of the present invention. In FIG. 15, "interface" represents an interface between the thin-film structure 210 and the substrate 200, and "surface" indicates a surface of the thin-film structure 210 corresponding to the upper nitride film 205.

As shown in FIG. 15, nitrogen atoms may exist in relatively high concentrations in the upper and the lower nitride films 205 and 205, respectively. In addition, a few nitrogen atoms may exist in the oxide film 202 because the nitrogen atoms in the upper nitride film 205 may migrate during the post-thermal treatment process.

As described above, the thin-film structure 210 includes the lower and the upper nitride films 203 and 205 with reduced damage therein so that hydrogen atoms and/or ions may not penetrate into the thin-film structure 210 in a subsequent process, and also fewer electrons may become trapped in the thin-film structure 210. Therefore, a non-volatile semiconductor device may have an enhanced reliability and/or electrical characteristics when the thin-film structure 210 is used as a tunnel oxide layer of a non-volatile semiconductor device.

Methods of Manufacturing a Non-Volatile Semiconductor Device

Figure 20:
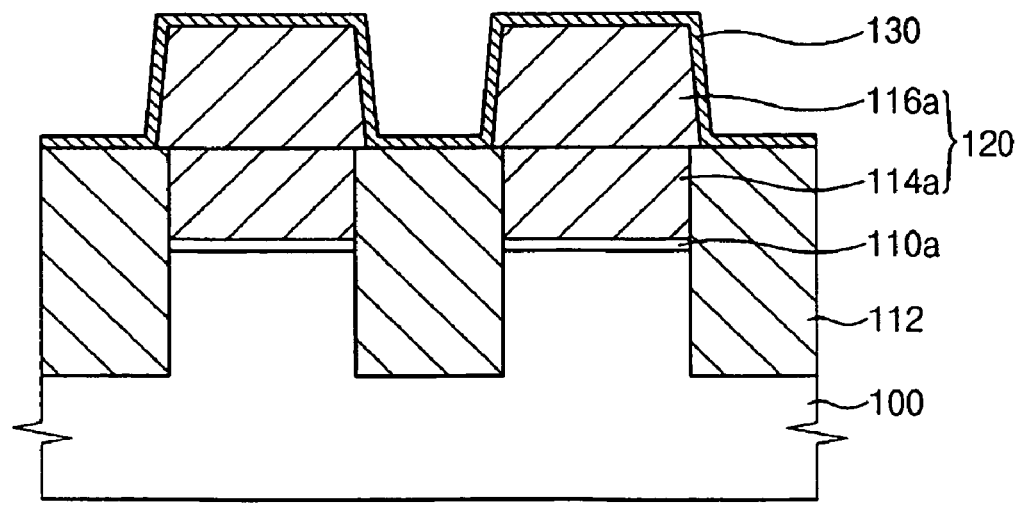
Figure 21:
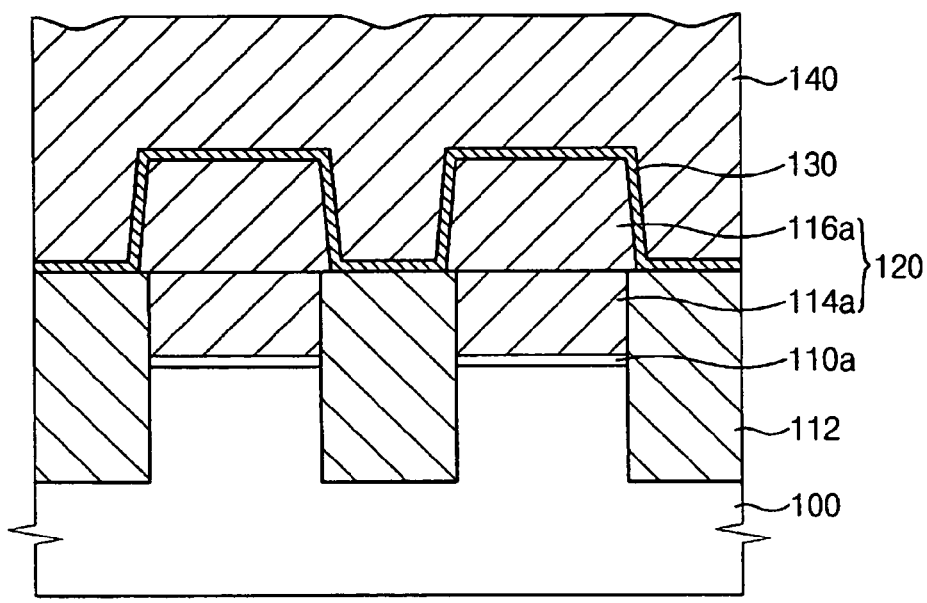
Figure 22:
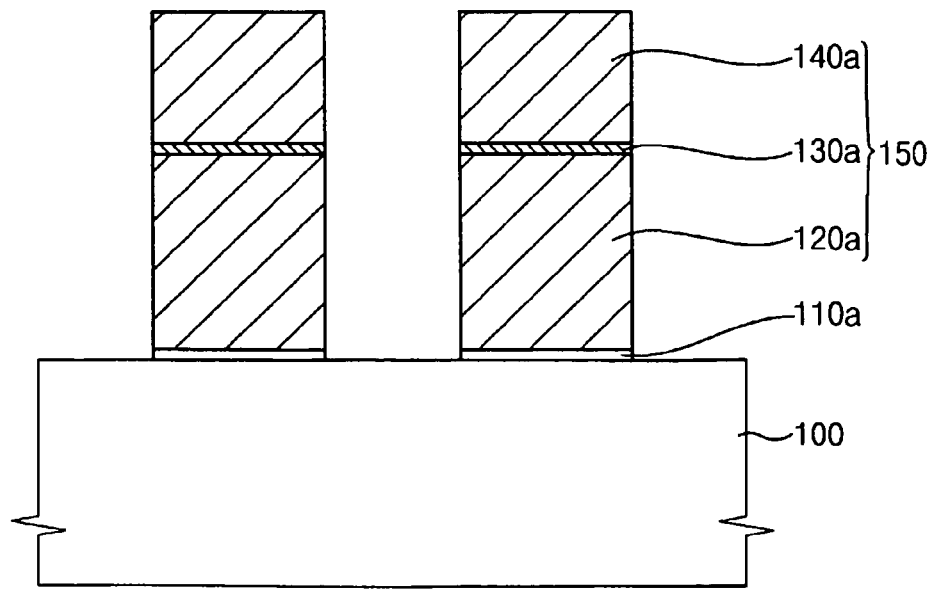

FIGS. 16 to 22 are cross-sectional views illustrating methods of manufacturing a non-volatile semiconductor device in accordance with some embodiments of the present invention. FIGS. 16 to 21 are cross-sectional views illustrating a non-volatile semiconductor device taken along a first direction substantially parallel to word lines of the non-volatile semiconductor device. FIG. 22 is a cross-sectional view illustrating the non-volatile semiconductor device taken along a second direction substantially parallel to bit lines of the non-volatile semiconductor device. The first direction may be substantially perpendicular to the second direction.

Figure 16:
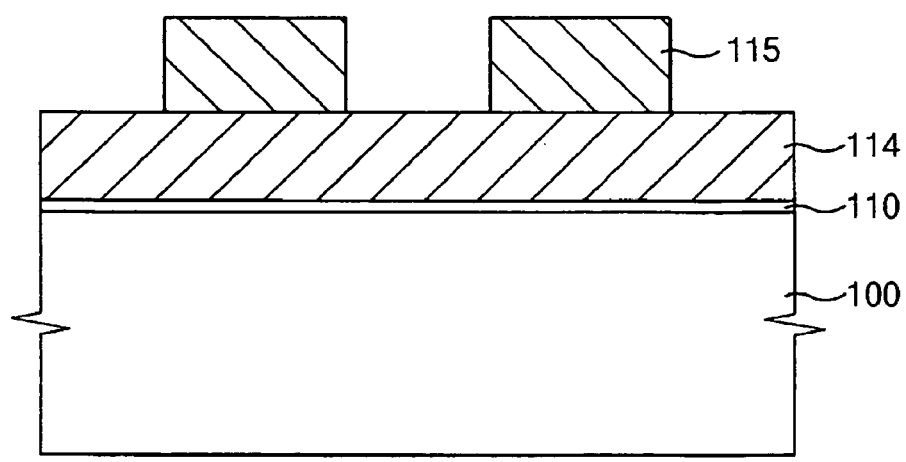
FIGS. 16 to 22 are cross-sectional views illustrating methods of manufacturing a non-volatile semiconductor device in accordance with some embodiments of the present invention.

Referring to FIG. 16, after a thin-film structure is formed on a substrate as a tunnel oxide layer 110, a first conductive layer 114 is formed on the tunnel oxide layer 110. First mask patterns 115 are formed on the first conductive layer 114.

In forming the thin-film structure serving as the tunnel oxide layer 110, an upper nitride film and a lower nitride film may be formed at an upper portion and a lower portion of an oxide film after the oxide film is formed on the substrate 100. The upper nitride film and the lower nitride film may be formed by a plasma nitration process and a thermal nitration process, respectively, as described above. Thus, the tunnel oxide layer 110 includes a lower nitride film, an oxide film and an upper nitride film on the substrate 100.

Since data retention characteristics of a non-volatile semiconductor device may mainly depend on the reliability of the tunnel oxide layer, any deterioration of the tunnel oxide layer may often serve as a limiting factor for achieving desired programming and/or erasing operations of the non-volatile semiconductor device. A non-volatile semiconductor device may be required to repeatedly perform more than about 1,000,000 cycles of programming and erasing operations. A tunnel oxide layer 110 formed according to some embodiments of the present invention may be advantageously employed for a non-volatile semiconductor device so as to improve the programming and the erasing operations thereof, because a tunnel oxide layer 110 formed according to some embodiments of the invention may have enhanced reliability and/or reduced deterioration.

In some embodiments of the present invention, after the upper nitride film of the tunnel oxide layer 110 is formed, for example, by a plasma nitration process, the lower nitride film of the tunnel oxide layer 110 may be formed, for example, through a thermal nitration process. In particular, a silicon oxide film is formed on the active region of the substrate 100, and then an upper portion of the silicon oxide film may be nitrified using a plasma generated from a first reaction gas including nitrogen. Nitrogen atoms may accumulate at an upper portion of the silicon oxide film so that the upper portion of the silicon oxide film may be changed into an upper nitride film by a reaction between the accumulated nitrogen atoms and silicon atoms in the silicon oxide film. The lower nitride film may be formed by thermally nitrifying a lower portion of the silicon oxide film using a second reaction gas. In the thermal nitration process, damage to the tunnel oxide layer 110 generated in the plasma nitration process may be at least partially cured, to thereby improve electrical characteristics of the tunnel oxide layer 110.

In further embodiments of the present invention, a silicon oxide film is formed on the active region of the substrate 100, and then the lower nitride film is formed at a lower portion of the silicon oxide film through a thermal nitration process. In the thermal nitration process, nitrogen atoms formed by thermally decomposing a first reaction gas may accumulate at the lower portion of the silicon oxide film. Hence, the lower portion of the silicon oxide layer may be converted into a lower nitride film as a result of a reaction between the accumulated nitrogen atoms and silicon atoms in the silicon oxide film. The upper nitride film may be formed at an upper portion of the silicon oxide film by a plasma nitration process. The plasma nitration process may cause nitrogen atoms to accumulate at the upper portion of the silicon oxide film. Thus, the upper portion of the silicon oxide film may be changed to an upper nitride film as a result of a reaction between the accumulated nitrogen atoms and the silicon atoms in the silicon oxide film. In that case, a post-thermal treatment process may further be performed on the tunnel oxide layer 110 so that damage to the tunnel oxide layer 110 generated in the plasma nitration process may be at least partially cured.

Referring now to FIG. 16, the first conductive layer 114 is formed on the tunnel oxide layer 110. The first conductive layer 114 may have a thickness of, for example, about 500 Å. The first conductive layer 114 may be formed, for example, by an LPCVD process using polysilicon doped with impurities. In that case, the impurities may be doped by a $POCl_3$ diffusion process, an ion implantation process, and/or an in-situ doping process. Alternatively, the first conductive layer 114 may be formed using amorphous silicon.

The first mask patterns 115 are formed on the first conductive layer 114. The first mask patterns 115 expose portions of the first conductive layer 114 adjacent to locations where floating gates are to be positioned. In forming the first mask patterns 115, a first mask layer may be formed on the first conductive layer 114. The first mask layer may be partially etched by a photolithography process using a photoresist pattern (not shown) to thereby form the first mask patterns 115 on the first conductive layer 114. The first mask layer may be formed using a nitride such as silicon nitride. Additionally, the first mask layer may be formed by an LPCVD process using an $SiH_2Cl_2$ gas, an $SiH_4$ gas and an $NH_3$ gas. Alternatively, the first mask layer may be formed a plasma-enhanced chemical vapor deposition (PECVD) process. After forming the first mask patterns 115, the photoresist pattern may be removed by an ashing process and/or a stripping process.

Figure 17:
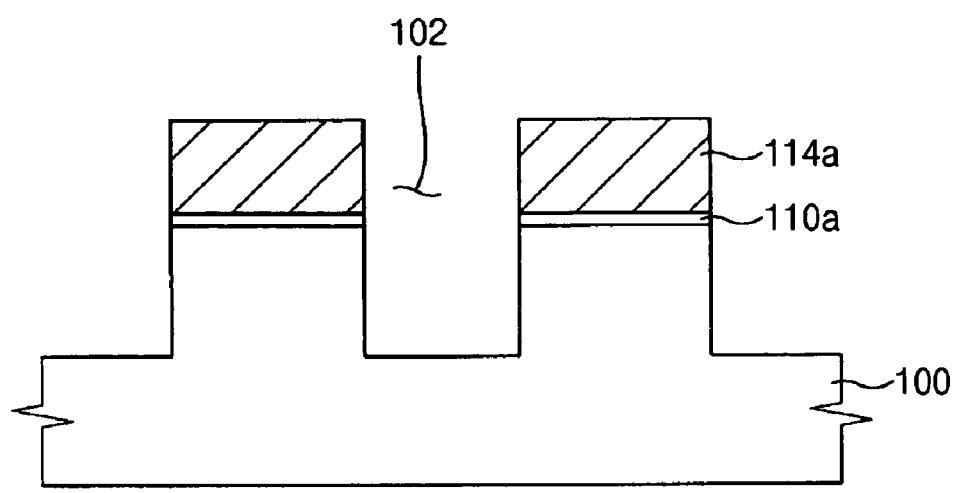

Referring to FIG. 17, trenches 102 are formed at first portions of the substrate 100, and first conductive layer patterns 114a and tunnel oxide layer patterns 110a are formed on second portions of the substrate 100 where the trenches 102 are not positioned.

In particular, portions of the first conductive layer 114 and tunnel oxide layer 110 exposed through the first mask patterns 115 are etched using the first mask patterns 115 as etching masks. Hence, the tunnel oxide layer patterns 110a and the first conductive layer patterns 114a are formed on the second portions of the substrate 100. The tunnel oxide layer patterns 110a and the first conductive layer patterns 114a may be formed, for example, by a dry etching process using an etching gas. Then, the first portions of the substrate 100 exposed through the first conductive layer patterns 114a may be partially etched to thereby form the trenches 102 between the first conductive layer patterns 114a along the first direction substantially parallel to word lines of the non-volatile semiconductor device. Each of the trenches 102 may have a depth of from about 1,200 Å to about 2,500 Å. For example, the depth of the trench 102 may be about 1,700 Å. When the trenches 102 are formed at the first portions of the substrate 100, active regions and floating gate formation regions are simultaneously defined.

In some embodiments of the present invention, liner nitride layers (not shown) may be formed on sidewalls of the trenches 102 in order to at least partially cure an etch damage to the substrate 100 generated in the etching process for forming the trenches 102 and/or to prevent or reduce a leakage current from flowing toward the substrate 100.

Figure 18:
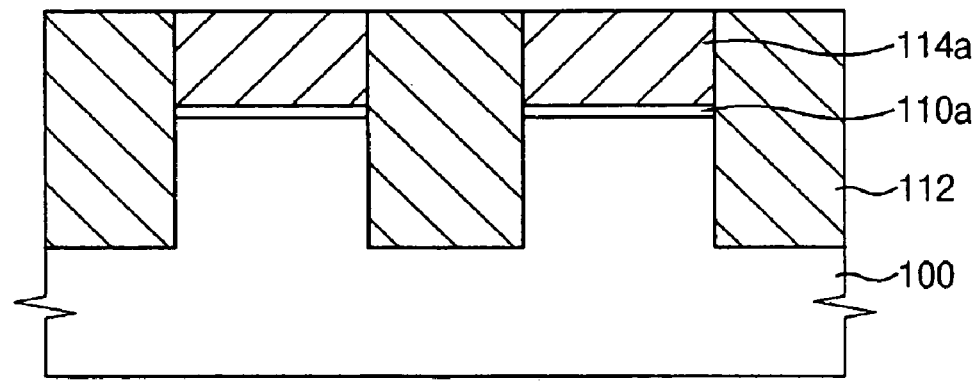

Referring to FIG. 18, isolation layer patterns 112 are formed in the trenches 102, respectively. The isolation layer patterns may be formed as follows. An oxide layer may be formed on the first conductive layer patterns 114a to fill up the trenches 102, and the oxide layer may be partially removed until the first conductive layer patterns 114a are exposed. The oxide layer may be partially removed through a chemical-mechanical polishing (CMP) process and/or an etch-back process.

In particular, the oxide layer filling up the trenches 102 may be formed on the first conductive layer patterns 114a by a high-density plasma chemical vapor deposition (HDP-CVD) process. When the oxide layer is partially removed until the first conductive layer patterns 114a are exposed, the isolation layer patterns 112 are formed in the trenches 102.

Figure 19:
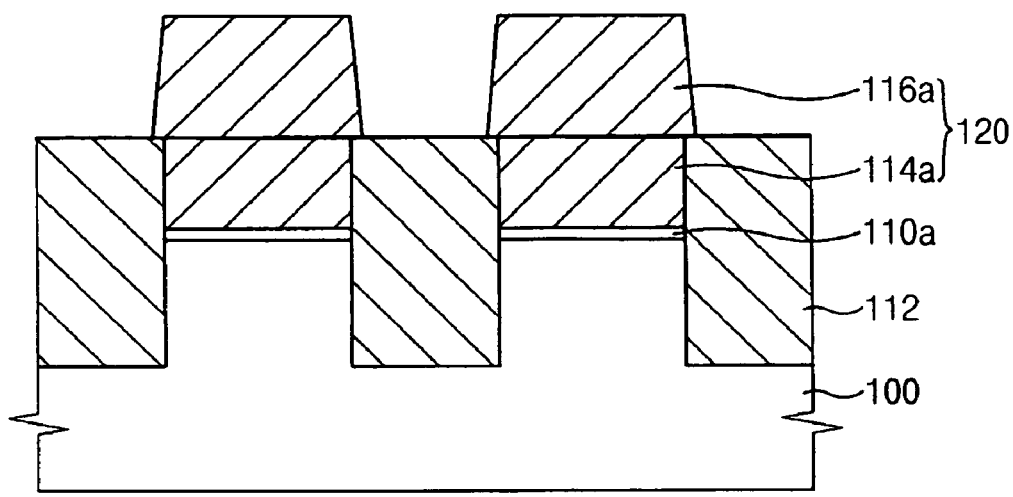

Referring to FIG. 19, second conductive layer patterns 116a are formed on the first conductive layer patterns 114a, respectively. Thus, first preliminary floating gates 120 are formed on the substrate 100. Each of the first preliminary floating gates 120 includes the first and the second conductive layer patterns 114a and 116a.

In particular, a second conductive layer may be formed on the isolation layer patterns 112 and the first conductive layer patterns 114a, for example, by an LPCVD process. The second conductive layer may be formed using polysilicon doped with impurities, or using a metal. For example, the second conductive layer may be formed using polysilicon doped with $N^+$ type impurities. After second mask patterns (not shown) are formed on the second conductive layer, the second conductive layer may be partially etched using the second mask patterns to thereby form the second conductive layer patterns 116a on the first conductive layer patterns 114a. Each of the second conductive layer patterns 116a may have a lower portion substantially wider than an upper portion of the first conductive layer pattern 114a.

Referring to FIG. 20, a dielectric layer 130 may be formed over the isolation layer patterns 112 and the first preliminary floating gates 120.

The dielectric layer 130 may have an oxide/nitride/oxide structure. Alternatively, the dielectric layer 130 may be formed using a metal oxide having a high dielectric constant. Examples of a metal oxide in the dielectric layer may include $HfO_2$, $ZrO_2$, $Ta_2O_5$, $Y_2O_3$, $Nb_2O_3$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in a mixture thereof.

In some embodiments of the present invention, the dielectric layer 130 may include a silicon oxide film, a silicon nitride film and a metal oxide film sequentially formed on the first preliminary floating gates 120 and the isolation layer patterns 112. In that case, the metal oxide film may be formed using a metal precursor by an atomic layer deposition (ALD) process. Alternatively, the metal oxide film may be formed by a CVD process using a reaction gas.

In further embodiments of the present invention, the dielectric layer 130 may include a metal oxide film, a silicon nitride film and an additional metal oxide film successively formed on the first preliminary floating gates 120 and the isolation layer patterns 112.

Referring to FIG. 21, a preliminary control gate 140 may be formed on the dielectric layer 130. The preliminary control gate 140 may be formed using polysilicon doped with impurities, or using a metal such as tungsten or titanium. For example, the preliminary control gate 140 may be formed using polysilicon doped with $N^+$ type impurities. Alternatively, the preliminary control gate 140 may have a polycide structure in which a polysilicon film and a metal silicide film are sequentially formed on the dielectric layer 130. In that case, the metal silicide film may be formed using tungsten suicide ($WSi_x$), titanium silicide ($TiSi_x$), cobalt silicide ($CoSi_x$), tantalum silicide ($TaSi_x$), etc.

Third mask patterns (not shown) are formed on the preliminary control gate 140. In particular, a nitride layer may be formed on the preliminary control gate 140 by an LPCVD process and/or a PECVD process. The nitride layer may be formed, for example, using an $SiH_2Cl_2$ gas, an $SiH_4$ gas and an $NH_3$ gas. The nitride layer may be patterned to form the third mask patterns through a photolithography process. The third mask patterns may be formed on the preliminary control gate 140 along the second direction substantially perpendicular to the first direction. For example, each of the third mask patterns may have a line shape extending along the second direction.

Referring to FIG. 22, portions of the preliminary control gate 140, the dielectric layer 130 and the preliminary floating gate 120 are sequentially etched using the third mask patterns, thereby forming gate structures 150 on the substrate 100. Each of the gate structures 150 includes the floating gate 120a, a dielectric layer pattern 130a and a control gate 140a successively formed on the tunnel oxide layer pattern 110a.

Figure 25:
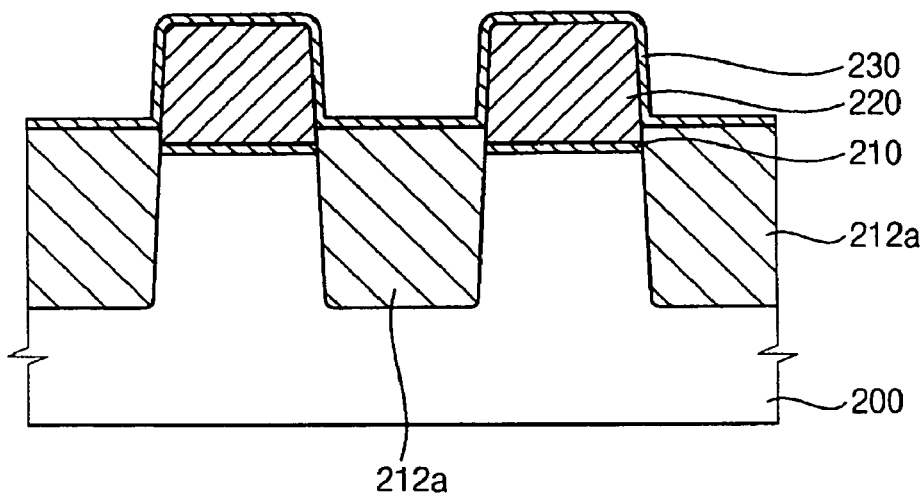
Figure 26:
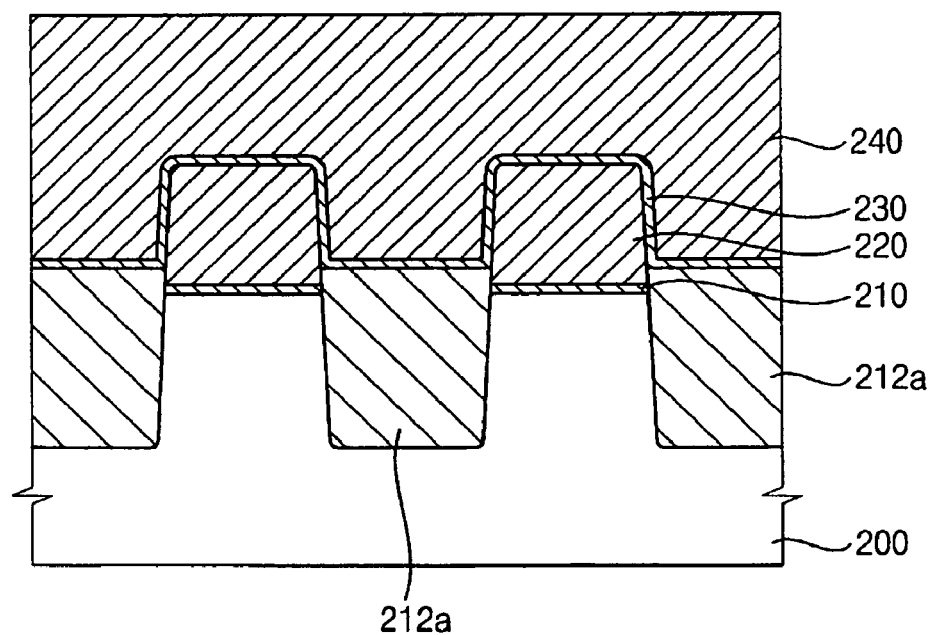
Figure 27:
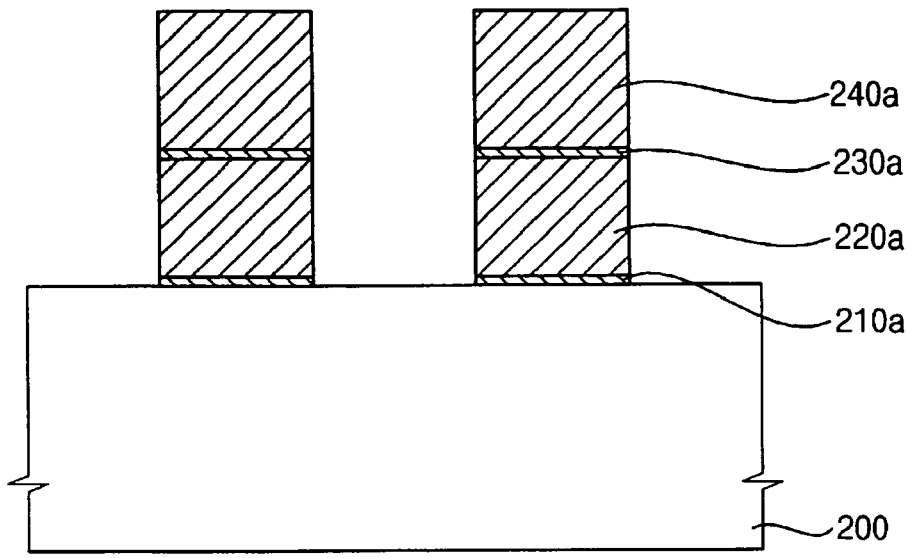

FIGS. 23 to 27 are cross-sectional views illustrating methods of manufacturing a non-volatile semiconductor device in accordance with further embodiments of the present invention. FIGS. 23 to 26 are cross-sectional views illustrating the non-volatile semiconductor device taken along a first direction substantially parallel to word lines of the non-volatile semiconductor device. FIG. 27 is a cross-sectional view illustrating the non-volatile semiconductor device taken along a second direction substantially parallel to bit lines of the non-volatile semiconductor device. The first direction may be substantially perpendicular to the second direction.

Figure 23:
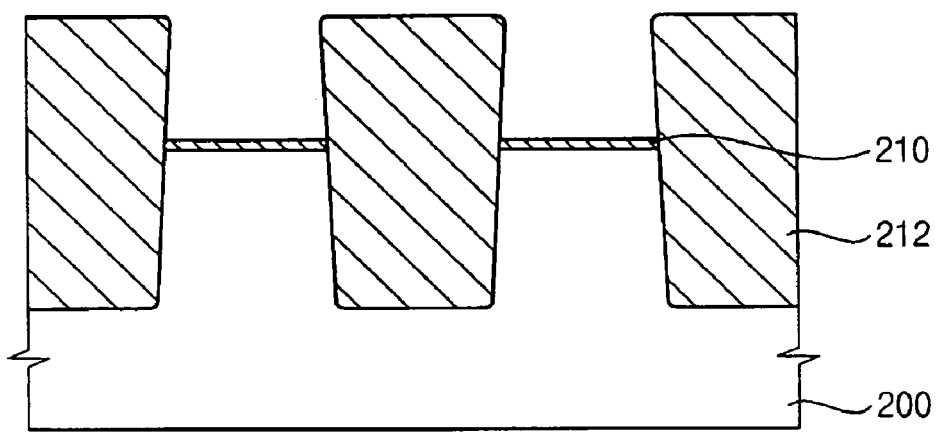
FIGS. 23 to 27 are cross-sectional views illustrating methods of manufacturing a non-volatile semiconductor device in accordance with some embodiments of the present invention.

Referring to FIG. 23, preliminary isolation layer patterns 212 are formed in trenches formed at upper portions of a substrate 200.

In forming the preliminary isolation layer patterns 212, a pad oxide layer (not shown) and a hard mask layer (not shown) are formed on the substrate 200. The pad-oxide layer may be formed by a thermal oxidation process and/or a CVD process. The hard mask layer may be formed using silicon nitride by an LPCVD process or a PECVD process. The hard mask layer may be etched by a photolithography process to form mask patterns (not shown) on the pad oxide layer. Using the mask patterns as etching masks, the pad oxide layer and the substrate 200 are partially etched to form pad oxide layer patterns (not shown) and the trenches. The trenches may extend along the first direction. Each of the trenches may have a depth of from about 1,000 Å to about 5,000 Å. For example, the trench may have a depth of about 2,300 Å.

In some embodiments of the present invention, nitride liners may be formed on sidewalls of the trenches to at least partially cure damage to the substrate 200 that may be generated in the etching process for forming the trenches.

After an insulation layer (not shown) is formed on the mask patterns to fill up the trenches, the insulation layer may be partially removed by a CMP process and/or an etch-back process until the mask patterns are exposed. In this manner, the preliminary isolation layer patterns 212 may be formed to fill up the trenches. When the pad oxide layer patterns and the mask patterns are removed from the substrate 200, portions of the substrate 200 are exposed through the preliminary isolation layer patterns 212. Thus, active regions (between the preliminary isolation patterns 212) and field regions may be defined.

Thin-film structures serving as tunnel oxide layer patterns 210 are formed on the exposed portions of the substrate 200. Each of the tunnel oxide layer patterns 210 may include an upper nitride film pattern, an oxide film pattern and a lower nitride film pattern. The upper nitride film pattern and the lower nitride film pattern may be formed by a plasma nitration process and a thermal nitration process, respectively, as described-above. Alternatively or additionally, the tunnel oxide layer patterns 210 may undergo a post-thermal treatment process to at least partially cure damage to the tunnel oxide layer patterns 210 that may be generated in the plasma nitration process.

Figure 24:
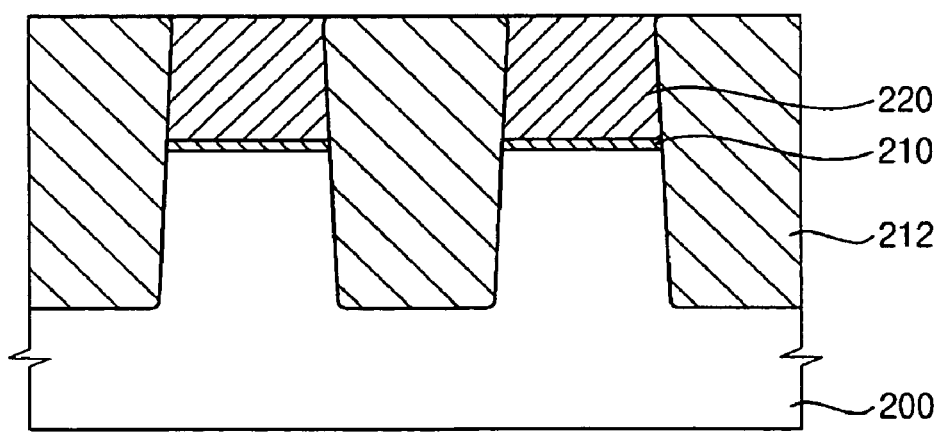

Referring to FIG. 24, a first conductive layer may be formed on the tunnel oxide layer patterns 210 and the preliminary isolation layer patterns 212 to fill up gaps between the preliminary isolation layer patterns 210. The first conductive layer may be partially removed until the preliminary isolation layer patterns 210 are exposed to form preliminary floating gates 220 on the tunnel oxide layer patterns 210 between the preliminary isolation layer patterns 212. The preliminary floating gates 220 may be formed, for example, by a CMP process and/or an etch-back process.

Referring to FIG. 25, upper portions of the preliminary isolation layer patterns 212 may be removed until upper portions of the preliminary floating gates 220 are exposed to form isolation layer patterns 212a in the trenches. Each of the isolation layer patterns 212a may be protruded from an upper face of the substrate 200.

A dielectric layer 230 may be formed on the isolation layer patterns 212a and the preliminary floating gates 220. The dielectric layer 230 may have an oxide/nitride/oxide structure. Alternatively or additionally, the dielectric layer 230 may be formed using a metal oxide having a high dielectric constant such as $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in a mixture thereof.

Referring to FIG. 26, a preliminary control gate 240 may be formed on the dielectric layer 230. The preliminary control gate 240 may be formed, for example, using polysilicon doped with $N^+$ type impurities or using a metal such as tungsten or titanium. Alternatively, the preliminary control gate 240 may have a polycide structure in which a polysilicon film and a metal silicide film are sequentially formed on the dielectric layer 230. In that case, the metal silicide film may be formed using tungsten silicide, titanium silicide, cobalt silicide, tantalum silicide, etc.

Additional mask patterns (not shown) may be formed on the preliminary control gate 240. The additional mask patterns may be formed on the preliminary control gate 240 along the second direction substantially perpendicular to the first direction. Each of the additional mask patterns may have a line shape extending along the second direction.

Referring to FIG. 27, portions of the preliminary control gate 240, the dielectric layer 230 and the preliminary floating gate 220 are sequentially etched using the additional mask patterns, to thereby form gate structures on the substrate 200. Each of the gate structures includes a floating gate 220a, a dielectric layer pattern 230a and a control gate 240a sequentially formed on the tunnel oxide layer pattern 210a.

Evaluation of Charge Trapping Characteristics of Tunnel Oxide Layers

Table 1 shows exemplary process conditions for forming a first tunnel oxide layer, a second tunnel oxide layer, a third tunnel oxide layer and a fourth tunnel oxide layer.

TABLE 1

|  | Plasma nitration process | Thermal nitration process |
|---|---|---|
| First tunnel oxide layer | ◯ | ◯ |
| Second tunnel oxide layer | ◯ | X |
| Third tunnel oxide layer | X | X |
| Fourth tunnel oxide layer | X | ◯ |

In Table 1, "◯" indicates that a plasma and/or thermal nitration process is carried out, whereas
"X" represents that the plasma and the thermal nitration processes are not executed.

Figure 28:
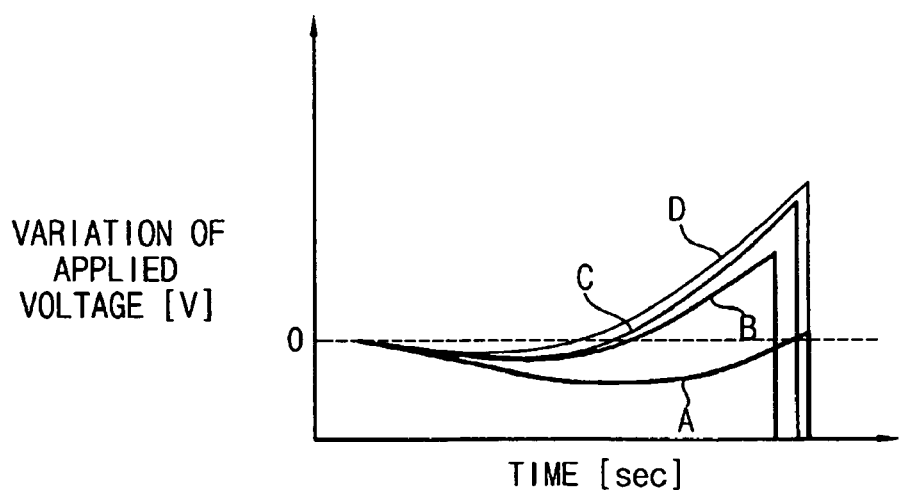
FIG. 28 is a graph illustrating charge trapping characteristics of tunnel oxide layers in accordance with some embodiments of the present invention.

FIG. 28 is a graph illustrating charge trapping characteristics of the first to the fourth tunnel oxide layers. In FIG. 28, the charge trapping characteristics of the first to the fourth tunnel oxide layers were obtained by measuring variations of voltages applied to the tunnel oxide layers relative to time. When a variation of a voltage applied to a tunnel oxide layer is high, more charge trapping sites may be generated in the tunnel oxide layer.

In FIG. 28, "A" indicates a voltage variation of the first tunnel oxide layer formed by the plasma and the thermal nitration processes, "B" represents a voltage variation of the second tunnel oxide layer obtained through the plasma nitration process without the thermal nitration process, "C" denotes a voltage variation of the third tunnel oxide layer formed without both of the plasma and the thermal nitration processes, and "D" indicates a voltage variation of the fourth tunnel oxide layer obtained by the thermal nitration process without the plasma nitration process.

Referring to FIG. 28 and Table 1, the voltage variation of the first tunnel oxide layer has the lowest value, whereas the voltage variation of the fourth tunnel oxide layer has the largest value. In addition, the voltage variation of the third tunnel oxide layer is a relatively higher than those of the first and the second tunnel oxide layers. Therefore, to improve charge trapping characteristics of a tunnel oxide layer, the tunnel oxide layer may be formed through a plasma nitration process and/or by plasma and thermal nitration processes.

Evaluation of Reliability of a Tunnel Oxide Layer

Figure 29:
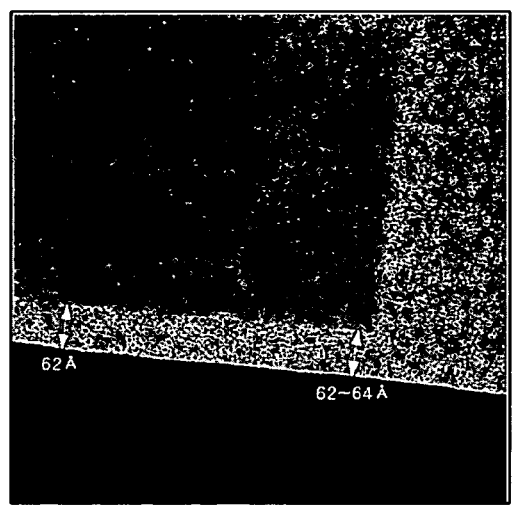
FIG. 29 is an electron microscopic picture showing a thickness variation of a tunnel oxide layer in a non-volatile semiconductor device in accordance with some embodiments of the present invention.

FIG. 29 is an electron microscopic picture showing a thickness variation of a tunnel oxide layer in a non-volatile semiconductor device formed in accordance with some embodiments of the present invention. The electron microscopic picture in FIG. 28 was obtained using a transmission electron microscope (TEM). In FIG. 28, the tunnel oxide layer was formed using a plasma nitration process and a thermal nitration process.

Referring to FIG. 29, a thickness of the tunnel oxide layer positioned between a silicon substrate and a floating gate was measured after a surface of a gate structure was oxidized. The thickness variation of the tunnel oxide layer was not detected. That is, the tunnel oxide layer may have an entirely uniform thickness without any bird's beak phenomenon at end portions of the tunnel oxide layer.

Measurement of Nitrogen Concentration in a Tunnel Oxide Layer

Figure 30:
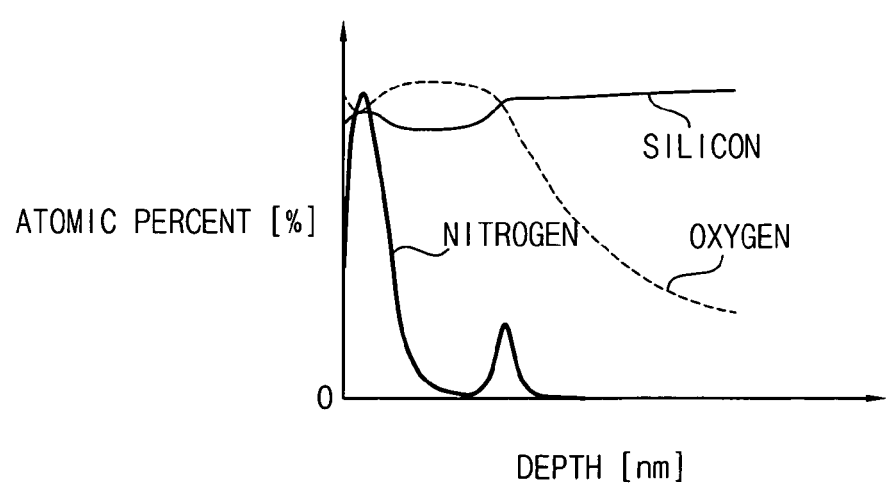
FIG. 30 is a graph illustrating contents of various atoms in tunnel oxide layers in accordance with some embodiments of the present invention.

FIG. 30 is a graph illustrating exemplary concentrations of various atoms in a tunnel oxide layer formed according to some embodiments of the present invention. In FIG. 30, concentrations of silicon atoms, oxygen atoms and nitrogen atoms were measured by detecting secondary ions generated from a surface of the tunnel oxide layer using an analyzer after colliding primary ion beams having an energy of from about several KeV to about 10 KeV into the surfaces of the tunnel oxide layer. Additionally, the contents of those atoms were measured from the surface of the tunnel oxide layer to a surface of a substrate.

As shown in FIG. 30, the content of nitrogen atoms is relatively high at an upper portion and a lower portion of the tunnel oxide layer when the tunnel oxide layer is formed through a plasma nitration process and a thermal nitration process, whereas the content of silicon atoms is relatively low in the tunnel oxide layer. In addition, the content of oxygen atoms is slightly high at a central portion of the tunnel oxide layer where there are fewer bonds of silicon and nitrogen. Therefore, the tunnel oxide layer may include the lower and the upper portions containing the bonds of silicon and nitrogen, so that the tunnel oxide layer may have enhanced electrical characteristics substantially without any deterioration and/or having reduced charge trapping sites and/or leakage current generated through the tunnel oxide layer.

According to some embodiments of the present invention, a thin-film structure having a lower nitride film, an oxide film and an upper oxide film may be obtained through a plasma nitration process, a thermal nitration process and/or a post-thermal treatment process. Since the thin-film structure includes the lower and the upper nitride films, hydrogen atoms or ions may not penetrate into the thin-film structure in a subsequent process carried out under an atmosphere containing hydrogen.

When the thin-film structure is employed as a tunnel oxide layer in a non-volatile semiconductor device, the tunnel oxide layer may have enhanced electrical characteristics as a result of having reduced charge trapping sites, dangling bonds of silicon and oxygen, strains generated due to the bonds of silicon and oxygen, etc. Additionally, the tunnel oxide layer may be formed without any bird's beak phenomenon. As a result, a non-volatile semiconductor device including a tunnel oxide layer formed according to some embodiments of the invention may have improved electrical characteristics and/or enhanced reliability.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a thin-film structure, comprising:
   forming an oxide film on a substrate;
   forming an upper nitride film on the oxide film by nitrifying an upper portion of the oxide film using a plasma nitration process; and
   forming a lower nitride film between the substrate and the oxide film by nitrifying a lower portion of the oxide film using a thermal nitration process.

2. The method of claim 1, wherein forming the lower nitride film further comprises at least partially curing a damage to the thin-film structure generated in the plasma nitration process.

3. The method of claim 1, further comprising performing a post-thermal treatment on the thin-film structure to at least partially cure a damage to the thin-film structure generated in the plasma nitration process.

4. The method of claim 3, wherein the post-thermal treatment is performed at a temperature between about 800° C. and about 1,100° C. using a reaction gas comprising an $N_2$ gas, an NO gas, an $N_2O$ gas and/or an $NH_3$ gas.

5. The method of claim 3, wherein the thermal nitration process is performed before the plasma nitration process.

6. The method of claim 1, wherein forming the lower nitride film is performed at a temperature between about 800° C. and about 1,100° C. using a reaction gas comprising an $N_2$ gas, an NO gas, an $N_2O$ gas and/or an $NH_3$ gas.

7. The method of claim 1, wherein forming the upper nitride film further comprises:
   generating a plasma from a reaction gas comprising an $N_2$ gas, an NO gas, an $N_2O$ gas and/or an $NH_3$ gas; and
   nitrifying the upper portion of the oxide film using the plasma.

8. The method of claim 1, wherein the plasma nitration process and the thermal nitration process are carried out in-situ.

9. A method of forming a thin-film structure comprising:
   forming an oxide film on a substrate;
   forming a first preliminary thin-film structure on the substrate by nitrifying an upper portion of the oxide film using a plasma nitration process, the first preliminary thin-film structure including the oxide film and an upper nitride film formed on the oxide film;
   forming a second preliminary thin-film structure on the substrate by nitrifying a lower portion of the oxide film using a thermal nitration process, the second preliminary thin-film structure including a lower nitride film formed between the substrate and the oxide film, the oxide film and the upper nitride film; and
   at least partially curing a damage to the second preliminary thin-film structure generated in the plasma nitration process through a post-thermal treatment process.

10. The method of claim 9, wherein the post-thermal treatment process is performed at a temperature between about 800° C. and about 1,100° C. using a reaction gas comprising an $N_2$ gas, an NO gas, an $N_2O$ gas and/or an $NH_3$ gas.

11. A method of manufacturing a non-volatile semiconductor device, comprising:
   forming a tunnel oxide layer on a substrate by forming an oxide film on the substrate, forming an upper nitride film on the oxide film by nitrifying an upper portion of the oxide film using a plasma nitration process, and forming a lower nitride film between the substrate and the oxide film by nitrifying a lower portion of the oxide film using a thermal nitration process;

forming a preliminary floating gate on the tunnel oxide layer;

forming a dielectric layer on the preliminary floating gate;

forming a preliminary control gate on the dielectric layer; and forming a floating gate, a dielectric layer pattern and a control gate by patterning the preliminary control gate, the dielectric layer and the preliminary floating gate.

12. The method of claim 11, further comprising:

forming an insulation layer pattern for defining an active region of the substrate prior to forming the oxide film; and cleaning the substrate including the insulation layer pattern.

13. The method of claim 11, further comprising performing a post-thermal treatment on the tunnel oxide layer to at least partially cure a damage to the tunnel oxide layer generated in the plasma nitration process.

14. The method of claim 13, wherein the post-thermal treatment is carried out at a temperature between about 800° C. and about 1,100° C. using a reaction gas comprising an $N_2$ gas, an NO gas, an $N_2O$ gas and/or an $NH_3$ gas.

15. The method of claim 13, wherein the thermal nitration process is carried out before the plasma nitration process.

16. The method of claim 11, wherein a damage to the tunnel oxide layer generated in the plasma nitration process is at least partially cured in the thermal nitration process.

17. The method of claim 11, wherein forming the lower nitride film is performed at a temperature between about 800° C. and about 1,100° C. using a reaction gas comprising an $N_2$ gas, an NO gas, an $N_2O$ gas and/or an $NH_3$ gas.

18. The method of claim 11, wherein forming the upper nitride film further comprises:

generating a plasma from a reaction gas comprising an $N_2$ gas, an NO gas, an $N_2O$ gas and/or an $NH_3$ gas; and nitrifying the upper portion of the oxide film using the plasma.

19. The method of claim 11, wherein the plasma nitration process and the thermal nitration process are carried out in-situ.

20. A non-volatile semiconductor memory device, comprising:

a tunnel oxide layer on a substrate, the tunnel oxide layer including a first nitrogen concentration peak near an interface of the tunnel oxide layer and the substrate and a second nitrogen concentration peak near a surface of the tunnel oxide layer opposite the interface between the tunnel oxide layer and the substrate;

a floating gate on the tunnel oxide layer;

a dielectric layer on the floating gate; and a control gate on the dielectric layer.

21. The non-volatile semiconductor memory device of claim 20, further comprising:

an oxygen concentration peak in the tunnel oxide layer between the first and second nitrogen concentration peaks.

22. The non-volatile semiconductor memory device of claim 20, wherein the dielectric layer comprises an oxide/nitride/oxide structure and/or a metal oxide.

23. The non-volatile semiconductor memory device of claim 20, wherein the control gate comprises doped polysilicon and/or polycide.

* * * * *